United States Patent

Harada et al.

Patent Number: 5,810,928
Date of Patent: Sep. 22, 1998

[54] METHOD OF MEASURING GAS COMPONENT CONCENTRATIONS OF SPECIAL MATERIAL GASES FOR SEMICONDUCTOR, A SEMICONDUCTOR EQUIPMENT, AND AN APPARATUS FOR SUPPLYING SPECIAL MATERIAL GASES FOR SEMICONDUCTOR

[75] Inventors: Hiroyuki Harada, Tokyo-To; Toshihiko Uno, Kyoto; Shigeyuki Akiyama, Otsu; Tetuo Shimizu, Kyoto, all of Japan

[73] Assignees: Mitsubishi Corporation, Ciyoda-ku; Horiba Co. Ltd.; Stec, Inc., both of Minami-ku, all of Japan; a part interest

[21] Appl. No.: 558,506

[22] Filed: Nov. 16, 1995

[30] Foreign Application Priority Data

Nov. 21, 1994 [JP] Japan .................................. 6-312440
Nov. 25, 1994 [JP] Japan .................................. 6-315549

[51] Int. Cl.$^6$ .................................................. C23C 16/00
[52] U.S. Cl. .......................... 118/690; 118/689; 118/691; 118/708; 118/712; 118/715
[58] Field of Search .................................. 118/712, 689, 118/690, 691, 708, 715

[56] References Cited

U.S. PATENT DOCUMENTS

| | | | |
|---|---|---|---|
| 4,430,959 | 2/1984 | Ebata | 118/697 |
| 5,032,435 | 7/1991 | Biefeld | 118/712 |
| 5,478,395 | 12/1995 | Bryselbout | 118/712 |

*Primary Examiner*—Richard Bueker
*Attorney, Agent, or Firm*—Reid & Priest LLP

[57] ABSTRACT

A method of measuring gas component Concentrations of special material gases for semiconductor, and a semiconductor equipment are provided. The method and apparatus can be incorporated in a gas pipe line system in an inline manner, and measure the component and concentration of a gas flowing through a gas pipe line or a gas with which the gas pipe line system is filled, thereby eliminating any erroneous connection. In the method of measuring gas component concentrations of special material gases for semiconductor, as means for attaining the objects, an infrared gas detector is disposed in a gas pipe line between a gas cylinder containing a special material gas for semiconductor and a semiconductor producing section, so that the gas component and concentration are measured in an inline manner. An apparatus for supplying special material gases for semiconductor is also provided. In the apparatus, a monitor for monitoring a gas component, a concentration, a flow rate, and the like is incorporated in a gas pipe line system from a gas cylinder storing room to a semiconductor equipment, so that any accident such as erroneous connection, erroneous piping, or erroneous exchange is prevented from occurring. As means for attaining the object, a massflow controller is disposed in each of pipe lines connected to a plurality of gas cylinders containing special material gases for semiconductor, and an infrared gas sensor functioning as an inline gas monitor is disposed in a pipe line between a junction point of the pipe lines and the semiconductor equipment. The massflow controllers and the infrared gas detector are connected to a control apparatus for the apparatus for supplying gases for semiconductor, and the respective output signals are checked. The supply of the gases is controlled in accordance with the agreement or disagreement of the signals.

9 Claims, 2 Drawing Sheets

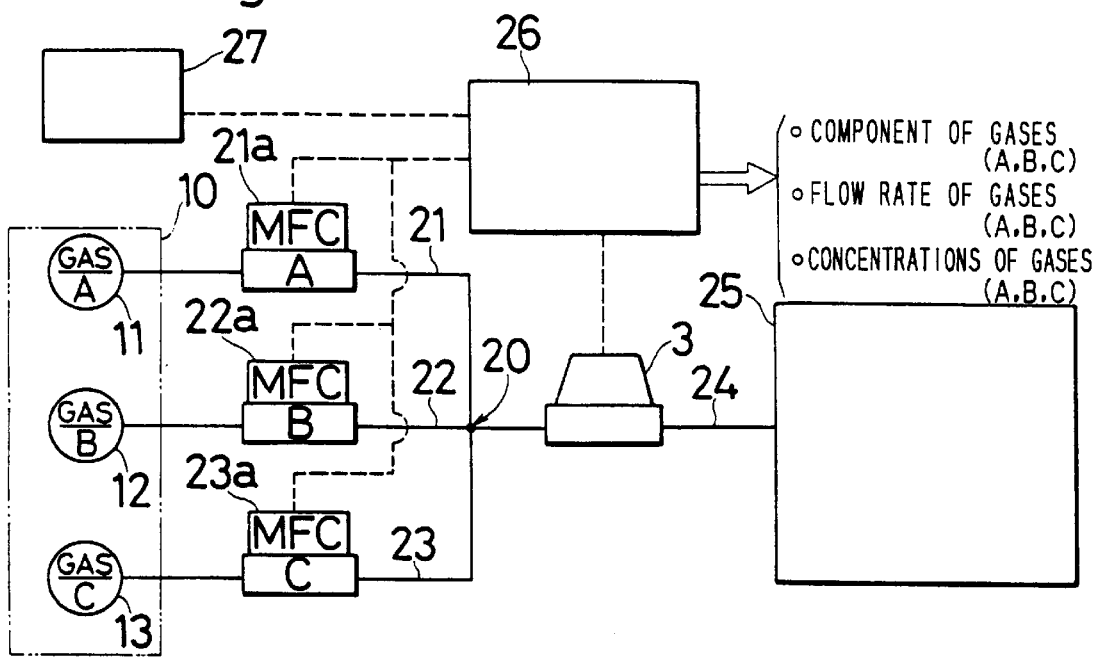

METHOD OF MEASURING GAS COMPONENT CONCENTRATIONS OF SPECIAL MATERIAL GASES FOR SEMICONDUCTOR, A SEMICONDUCTOR EQUIPMENT, AND AN APPARATUS FOR SUPPLYING SPECIAL MATERIAL GASES FOR SEMICONDUCTOR

BACKGROUND OF THE INVENTION

The invention relates to a method of measuring gas component concentrations of special material gases for semiconductor such as monosilane ($SiH_4$), and phosphine ($PH_3$) used in semiconductor production in an actual production process line (inline), and a semiconductor equipment and an apparatus for supplying special material gases for semiconductor into which a gas component concentration meter utilizing the measuring method is incorporated. The invention relates also to an apparatus for supplying special material gases for semiconductor which can monitor and control the concentration, the flow rate, and the like of each component of various special material gases for semiconductor used in a semiconductor equipment.

Conventionally, a gas-leak detector which detects a very small amount of a special material gas for semiconductor leaking from a gas cylinder has been commercially available and widely used. However, a measuring device which can measure the gas component and concentration of a special material gas for semiconductor charged in a gas cylinder in an actual production process line (inline) is not commercially available. Accordingly, at present, a semiconductor manufacturer uses a gas while trusting the component and concentration of the gas indicated on the gas cylinder.

As means for measuring the concentration of a special material gas contained in a gas cylinder, known is a method in which a sampling pipe line is formed as a part of a gas pipe line system for a semiconductor equipment or a gas cylinder storage room and the concentration is analyzed with a gas chromatography. Other known means for measuring a gas concentration include measuring methods utilizing a supersonic type concentration meter, a light refractometer, and the like. However, the method utilizing the gas chromatography causes the gas pipe line system to have "an unused space (dead space)", so that the purge operation becomes troublesome. In addition, the sampled gas is required to be rendered harmless before it is discharged.

An ultrasonic sensing method concentration meter and a light refractometer are not provided with selectivity for detecting the kinds of gases. When the measured value is changed during the measuring operation, for example, it is impossible to judge whether the change is caused by the variation of the gas concentration, or by the use of a gas of another kind.

The component and concentration of a special material gas for semiconductor are analyzed and measured by a gas manufacturer, and indicated on the gas cylinder or an analysis report is attached to the gas cylinder, thereby informing the user (a semiconductor manufacturer, or the like) of them. In such a case, the check on whether the indication or the analysis report is correct or not can be conducted only by a method in which the gas is particularly sampled and the sampled gas is analyzed and measured by the gas chromatography, or the like. Even if there is no error on the side of the gas manufacturer, there may occur a case where the user erroneously connects the gas cylinder or mistakenly connects a different cylinder. Such erroneous connection, piping, exchange, and the like occur easily and often. At present, there is no method of perfectly preventing such wrong uses from occurring. Moreover, such erroneous connection and piping cannot be prevented from occurring, and they cannot be checked in a centralized manner in the operation and maintenance room, so that they always constitute problems in safety management.

A semiconductor manufacturer controls Concentrations and flow rates of mixture components by means of a gas supplying apparatus. However, the check mechanism for safety and monitor items (component, concentration, flow rate, etc.) is imperfect. For example, a person reads the items of the gas components, the concentrations, and the like which are previously indicated on the cylinder by the gas producer, and these parameters are input into a control apparatus through a setting device, so that gas flow rates are set as output values of a massflow controller for controlling flow rates. In the case where two or more gas components are to be mixed with each other, however, the composition of each gas component supplied to the semiconductor equipment cannot be controlled.

SUMMARY OF THE INVENTION

The invention has been conducted in view of the above-mentioned circumstances. It is an object of the invention to provide a method of measuring gas component concentrations of special material gases for semiconductor, and a semiconductor equipment which can be incorporated as a process line (inline) in a gas pipe line system of a gas cylinder storing room, which can measure a component and concentration of a gas flowing through the gas pipe line or a gas with which the gas pipe line is filled, and which can prevent any accident such as erroneous connection, erroneous piping, or erroneous exchange from occurring. It is another object of the invention to provide an apparatus for supplying special material gases for semiconductor which can measure kinds, concentrations, and flow rates of component gases of a mixed gas flowing through a mixed-gas pipe line so that the kind, concentration, and flow rate of each component gas supplied from a gas cylinder are checked, thereby preventing any accident such as erroneous connection, erroneous piping, or erroneous exchange from occurring.

It is a principal object of the invention to provide: a method of measuring gas component Concentrations of special material gases for semiconductor, wherein a gas detector is disposed in a gas pipe line between gas cylinders containing the special material gases for semiconductor and a semiconductor producing section, so as to measure gas components and/or gas Concentrations in an inline manner; a method of measuring gas component Concentrations of special material gases for semiconductor, wherein the gas detector is an infrared detector or an ultraviolet detector; a method of measuring gas component Concentrations of special material gases for semiconductor, wherein the gas detector is disposed in a pipe line between a junction pipe line to which pipe lines connected to a plurality of gas cylinders containing special material gases for semiconductor are connected, and the semiconductor producing section; a semiconductor equipment wherein a gas detector for measuring a gas component and/or a gas concentration in an inline manner is disposed in a gas pipe line between a gas cylinder containing the special material gas for semiconductor and a semiconductor producing section; and a semiconductor equipment wherein the gas detector is an infrared detector or an ultraviolet detector.

It is a principal object of the invention to provide: an apparatus for supplying special material gases for semiconductor, wherein a massflow controller is disposed in each of pipe lines connected to a plurality of gas cylinders containing special material gases for semiconductor, an inline gas monitor is disposed in a pipe line between a junction point of the pipe lines and a semiconductor equipment, and the massflow controller and the inline gas monitor are connected to a control apparatus of an apparatus for supplying gases for semiconductor; an apparatus for supplying special material gases for semiconductor, wherein an output signal indicative of a gas component and a concentration and from the inline gas monitor is checked against an input and/or output signal of the massflow controller, and the gas supply is controlled in accordance with agreement or disagreement of the signals; and an apparatus for supplying special material gases for semiconductor, wherein a massflow controller and an inline gas monitor are disposed in each of pipe lines connected to a plurality of gas cylinders containing special material gases for semiconductor, a junction point of the pipe lines is connected to a semiconductor equipment by a junction pipe line, and the massflow controller and the inline gas monitor are connected to a control apparatus of an apparatus for supplying gases for semiconductor.

According to the above-described method of measuring gas component Concentrations of special material gases for semiconductor and the semiconductor equipment, an infrared-ray source is disposed in the gas detector so that the kinds and Concentrations of the special material gases for semiconductor can be detected by a pyroelectric sensor. Each special material gas for semiconductor has a specific infrared absorption spectrum. When infrared rays are emitted to a gas flowing through a gas flow path in the gas detector so as to be absorbed by the gas, therefore, a kind, concentration, and flow rate of the gas can be measured and monitored. In this case, as for the measurement, the gas detector is assembled as an inline element. Consequently, it is possible to realize non-contact and non-destructive measurement, and dirt and particles are not produced. An electromagnetic valve and the gas detector disposed in a pipe line are connected to a control apparatus which is not shown. When any abnormality occurs, the electromagnetic valve can be immediately closed. In the case where an ultraviolet detector is used as the gas detector, an ultraviolet-ray source is used instead of the infrared-ray source, but the function is the same.

Since each gas in a mixed gas has its specific infrared absorption spectrum, the component and concentration of each gas can be simultaneously measured by the gas detector. The gas detector monitors the preset mixture concentration. If any change occurs in the component, the abnormality is immediately detected, and the gas supply can be stopped by operating the electromagnetic valve or the like.

In the case where a massflow controller is disposed in each pipe line, it is possible to check the precision of the gases charged into the respective gas cylinders, the accuracy of the massflow controllers (MFCs) disposed in the respective pipe lines, and the like. As a result of checking the signals from the respective massflow controllers (MFCs) against the signal from the inline gas monitor (the infrared gas detector), if they agree with each other in an allowable range, the gases are directly supplied as they are. If they do not agree with each other, for example, electromagnetic valves which are disposed in the pipe lines or in the junction pipe line are controlled so that the supply of the gases can be stopped.

BRIEF DESCRIPTION OF THE DRAWINGS

FIG. 3 is a diagram of a piping system for a mixed gas in the case where a plurality of special material gases for semiconductor are simultaneously used by a mixed-gas supplying apparatus in, for example, a semiconductor equipment.

DETAILED DESCRIPTION OF THE PREFERRED EMBODIMENTS

Hereinafter, embodiments of the invention will be described with reference to the accompanying drawings.

Figure 1:
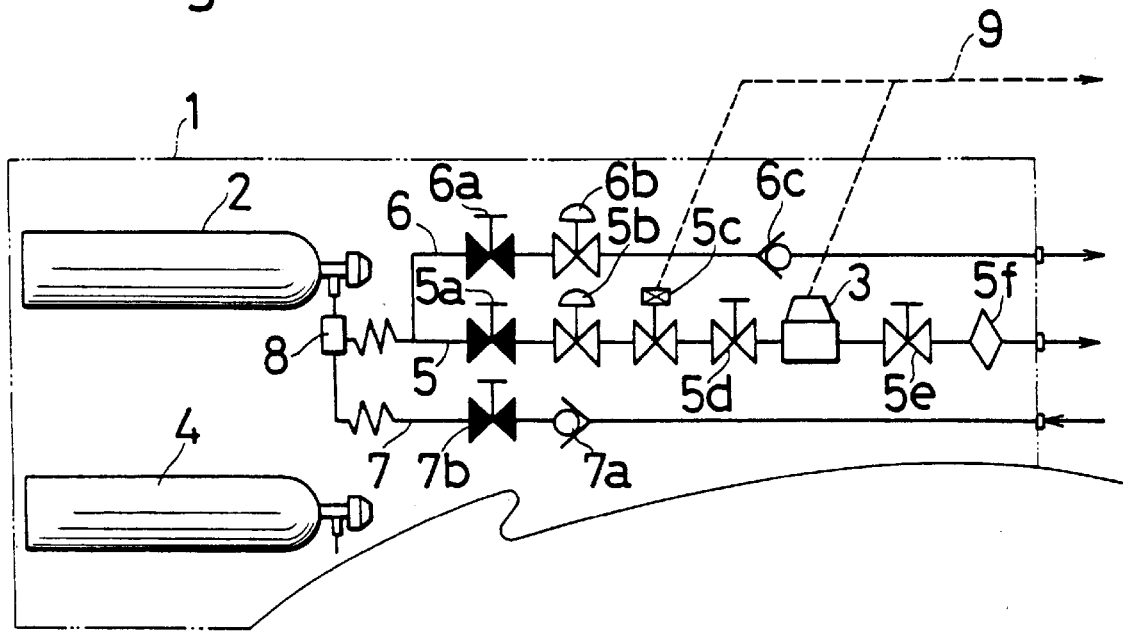
FIG. 1 is a diagram of a piping system for executing the method of measuring gas component Concentrations of special material gases for semiconductor according to the invention.

Referring to FIG. 1, 1 designates a cylinder box in which an enclosed space is formed in order to prevent leakage of a poisonous gas component and explosion from occurring. The cylinder box 1 stores gas cylinders 2 and 4 which respectively contain special material gases for semiconductor such as monosilane, arsine, phosphine, and the like used in a semiconductor equipment. In the cylinder box 1, a process pipe line 5 through which the corresponding material gas flows to a semiconductor producing section, a discharge pipe line 6, and a purge gas pipe line 7 are disposed. After the system is purged with a purge gas, a selector valve 8 is switched so that the material gas is supplied from the cylinder 2 to the process pipe line 5.

The process pipe line 5 comprises an open-and-close valve 5a, a pressure reducing valve 5b, an electromagnetic valve 5c, a gas detector 3 between other open-and-close valves 5d and 5e, and a filter 5f. The gas of the gas cylinder 2 is supplied after its pressure is usually reduced to about 2 to 5 kgf/cm² (gauge pressure).

The discharge pipe line 6 comprises an open-and-close valve 6a, a pressure reducing valve 6b, and a check valve 6c. The pipe line 6 is used for discharging the purge gas when the process pipe line 5 is purged by the purge gas.

The purge gas pipe line 7 comprises a check valve 7a and an open-and-close valve 7b. When the gas cylinder 2 is exchanged with a cylinder which contains another material gas, the purge gas ($N_2$, Ar, or the like) is caused to flow through the pipe line 5 so as to purge the pipe line 5. The gas detector 3 and the electromagnetic valve 5c are controlled by a signal 9 from a control apparatus (CPU) which is not shown but externally disposed.

Figure 2:
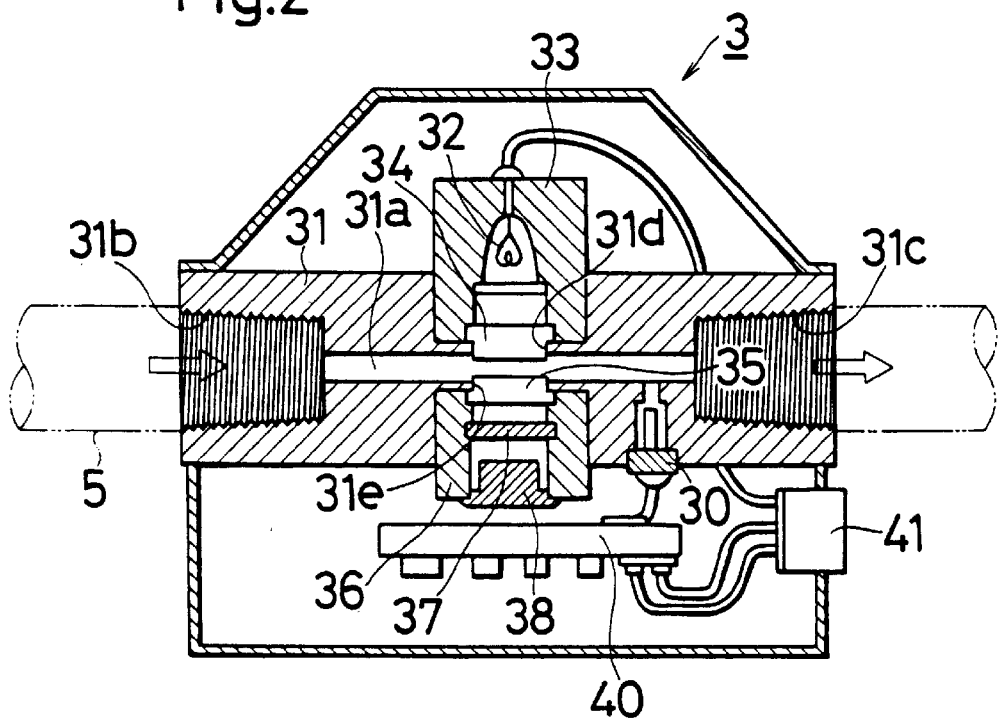
FIG. 2 is a cross section view showing in detail the configuration of a gas detector disposed in a process pipe line.

As shown in FIG. 2, the gas detector 3 is disposed in an inline manner in the process pipe line 5 which actually supplies the gas to the semiconductor equipment.

A cell block 31 comprises a gas flow path 31a, and female screw portions 31b and 31c for the connection to piping joints are provided on both sides of the cell block 31. In a center portion of the cell block 31, windows 31d and 31e are provided on upper and lower sides of the flow path 31a so as to be directed toward (or faced to) the flow path 31a. A metal ring 34 is fitted into the upper window 31d. The metal ring 34 is fixed to a light source block 33 to which an infrared-ray source 32 is attached. A metal ring 35 which is fixed to a sensor block 36 is fitted into the lower window 31e. An interference filter (a bandpass filter) 37 having a wavelength corresponding to the absorption characteristics of the gas to be measured, and a sensor (e.g., a pyroelectric sensor) 38 are attached to the sensor block 36. The metal rings 34 and 35 are fixed to the cell block 31 by brazing. In this way, the cell block 31 has a gas-tight structure so that a poisonous gas or a gas which may cause an explosion cannot leak to the outside of the cell block 31. The pyroelectric sensor 38 is connected to an amplifier 40 which is connected to the control apparatus (CPU) (not shown) via a connector 41.

In the flow path 31a of the cell block 31, a pressure sensor 30 is disposed so that the pressure of the flowing gas is measured at the same time as the measurement of the concentration of the gas. That is, since the gas pressure and the concentration signal (the infrared absorption ratio) of the infrared sensor have the one-to-one relationship, the pressure sensor 30 is disposed in the gas detector 3 in order to ensure accurate concentration measurement.

As described above, the infrared-ray source 32 is disposed in the gas detector 3, and therefore the kind and concentration of a special material gas for semiconductor can be detected by the pyroelectric sensor 38. A special material gas for semiconductor has its specific infrared absorption spectrum. When infrared rays are emitted to and absorbed by the gas flowing through the gas flow path 31a in the gas detector 3, therefore, it is possible to measure and monitor the kind and concentration of the gas. In the measurement, the gas detector 3 is assembled as an inline element so that it is possible to realize non-contact and non-destructive measurement, and dirt and particles are not produced. The electromagnetic valve 5c and the gas detector 3 disposed in the pipe line 5 are connected to the control apparatus which is not shown. When any abnormality occurs, the electromagnetic valve 5c is immediately closed so that the gas supply is stopped.

FIG. 3 is a diagram of a mixed-gas piping system employed in the case where a plurality of special material gases for semiconductor are simultaneously supplied from a mixture-type gas supplying apparatus in the apparatus for supplying special material gases for semiconductor (the semiconductor equipment) of the invention. In the embodiment, three kinds of gases (A, B, and C) are simultaneously used. A gas cylinder 11 which is filled with the gas A, a gas cylinder 12 which is filled with the gas B, and a gas cylinder 13 which is filled with the gas C are accommodated in a cylinder storing room 10 having an enclosed space from which any poisonous gas component and explosive component cannot leak. A pipe line 21 connected to the gas cylinder 11, a pipe line 22 connected to the gas cylinder 12, and a pipe line 23 connected to the gas cylinder 13 are connected together at a junction point 20 to a junction pipe line 24. The junction pipe line 24 is connected to a semiconductor equipment 25. In the embodiment, the gases A, B, and C are mixed with each other by a mixing apparatus which is not shown but disposed at the junction point 20, and the mixed gas is supplied to the semiconductor equipment 25. The pipe line 21 for the gas cylinder 11 is provided with a massflow controller (MFC) 21a, the pipe line 22 for the gas cylinder 12 is provided with a massflow controller (MFC) 22a, and the pipe line 23 for the gas cylinder 13 is provided with a massflow controller (MFC) 23a. The gases A, B, and C are supplied at predetermined pressures, respectively. Each pipe line is provided with the dedicated massflow controller, so that the flow-rate mixing ratio is previously determined so as to obtain predetermined gas components. Then, the mixed gas is supplied to the semiconductor equipment 25. In each of the massflow controllers (MFCs), the zero point, the span point, the control range, and the like are determined.

In the junction pipe line 24, the infrared gas detector 3 is disposed as an inline gas monitor. In the apparatus for supplying special material gases for semiconductor, the mixed gas of the gases A, B, and C is caused to pass through the infrared gas detector 3 disposed in the junction pipe line 24, so that the mixed gas is supplied to the semiconductor equipment 25 while the components, the Concentrations, and the flow rate of the mixed gas are monitored. Although not shown in FIG. 3, open-and-close valves, pressure reducing valves, electromagnetic valves, and the like are disposed in the respective pipe lines 21, 22, and 23, and also in the junction pipe line 24 to which the pipe lines are joined.

Each special material gas for semiconductor in the mixed gas has its specific infrared absorption spectrum. When the infrared gas detector 3 is disposed in the mixed-gas pipe line 24 as described above, therefore, the infrared rays are emitted to and absorbed by the gas flowing through the gas flow path 31a of the infrared gas detector 3, whereby the kind, the concentration, the flow rate, and the like of the gas component can be simultaneously measured and monitored.

Referring to FIG. 3, the massflow controllers (MFCs) 21a, 22a, and 23a, and the infrared gas detector 3 are connected to a control apparatus 26 for the apparatus for supplying gases for semiconductor. A setting device 27 is connected to the control apparatus 26 for the apparatus for supplying gases for semiconductor. In this way, the information on measured components and output from the infrared gas detector 3 is checked to see whether it agrees or does not agree with the input or output information of the massflow controllers (MFCs) 21a, 22a, and 23a which output the concentrations, the flow rates, and the like of the respective components.

Specifically, kinds and concentrations of gas components and physical values of gases (values analyzed by the gas producer) are previously input to the control apparatus 26 for the apparatus for supplying gases for semiconductor via the setting device 27. Each of the massflow controllers (MFCs) 21a, 22a, and 23a performs a predetermined flow-rate control for the preset value of each gas, and outputs a flow-rate signal. The compositions a plurality of component gases are mixed are obtained depending on the accuracy of the flow rates controlled by the respective massflow controllers (MFCs), but in a usual situation, the monitoring is not always performed. The measurement results from the infrared gas detector 3, for example, the concentration signals for the gas A/gas B/gas C are analyzed, whereby the concentration signals of the gas A/gas B/gas C obtained from the flow-rate signals from the massflow controllers (MFCs) 21a, 22a, and 23a are sequentially compared and checked. In this way, the accuracy of the massflow controllers (MFCs) 21a, 22a, and 23a, and the precision of the gas concentrations in the gas cylinders 11, 12, and 13 which have been input to the setting device 27 can also be checked at the same time.

The apparatus for supplying special material gases for semiconductor of the invention has the above-described construction. As described above, the precision of the gases with which the gas cylinders 11, 12, and 13 are filled, the accuracy of the massflow controllers (MFCs) 21a, 22a, and 23a disposed in the respective pipe lines, and the like can be checked. If, as a result of checking the signals from the respective massflow controllers (MFCs) 21a, 22a, and 23a against the signal from the infrared gas detector 3, they agree with each other in an allowable range, the gases are supplied as they are. If they do not agree with each other, for example, an electromagnetic valve which is not shown but disposed in the pipe line 11, 12, or 13 or the junction pipe line 24 is closed, so that the supply of the gas can be stopped.

In the above-described embodiment of the invention, the infrared gas detector 3 is disposed in the mixed-gas flow line 24. In the combination of the massflow controller (MFC) and an inline gas monitor, if the inline gas monitor can monitor only one gas component, the junction pipe line 24 may be eliminated, and an inline gas monitor which can analyze one gas component to be measured may be disposed immediately after each of the massflow controllers (MFCs) 21a, 22a, and 23a disposed in the respective pipe lines 11, 12, and 13. The embodiment described above uses a non-dispersive infrared detector as the infrared gas detector 3. Instead of the infrared detector, an ultraviolet detector may be used for monitoring a gas having an absorption characteristic in the ultraviolet absorption band.

According to the invention, in the method of measuring gas component Concentrations of special material gases for semiconductor and the apparatus for supplying a special material gas for semiconductor, kinds and concentrations of gases supplied from cylinders can be measured simultaneously, safely and easily in a process line (inline).

Since the gas detector is disposed as an inline element, a rapid response can be attained so that, immediately after it is judged that there is an abnormality in the kind or concentration of the gas, the gas supply is stopped by the control apparatus. In addition, according to the invention, the kind and concentration of a gas can be simultaneously measured in the inline manner. This is extremely convenience in view of the production management and the safety management.

Furthermore, according to the present apparatus for supplying special material gases for semiconductor, the reliability on information related to the kinds (the names of components), composition concentrations, flow rates, and the like of gases which are to be supplied to a semiconductor equipment can be increased. The centralized management can be realized by directly disposing a gas monitor for a special material gas for semiconductor in the process line of the semiconductor production, and by inputting the signal from the massflow controller to a central monitoring control apparatus (CPU). The input (output) information of the massflow controller (the name of a gas component, the composition concentration, the gas physical values) is checked against the judgment on the component and the concentration information obtained by the inline gas monitor, so that the reliability on the respective monitor items is increased. In addition, even if there occurs erroneous piping or erroneous connection during the exchange of gas cylinders, the change of the pipe lines, or the like, the operation of the gas supplying apparatus is stopped, so as to ensure the safety.

The employed gas detector utilizes the gas characteristics for absorbing infrared rays or ultraviolet rays, and hence it is possible to prevent dirt and particles from being produced.

What is claimed is:

1. A semiconductor equipment comprising:
   a plurality of respective gas cylinders containing a respective plurality of special material gases;
   a semiconductor producing section;
   gas pipe line means for carrying the special material gases from the plurality of gas cylinders to the semiconductor producing section; and
   inline gas detector means for measuring gas components and concentrations in the gas pipe line means.

2. The equipment of claim 1 wherein the gas detector means includes:
   an infrared detector.

3. The equipment of claim 1, wherein the gas detector means includes:
   an ultraviolet detector.

4. The equipment of claim 1, wherein the inline gas detector means includes:
   a gas flow pathway having first and second ends by which gas respectively enters and exits the gas detector means;
   a light source and a corresponding light sensor disposed on optically opposite sides of the gas flow pathway, the light source emitting light through a first window into the gas flow pathway and through a second window to be sensed differently by the corresponding light sensor based on differing gas components and concentrations in the gas flow pathway; and
   means for communicating to a controller, resulting gas component and concentration measurements from the light sensor.

5. An apparatus for supplying to semiconductor equipment, special material gases from a plurality of respective gas cylinders, the apparatus comprising:
   a plurality of pipe lines that are connected to respective gas cylinders from among the plurality of gas cylinders, the plurality of pipelines being connected in parallel and coming together at a junction;
   a plurality of massflow controllers disposed in respective pipe lines from among the plurality of pipe lines;
   an inline gas monitor, disposed in a junction pipe line that is connected between the junction and the semiconductor equipment; and
   a controller connected to the mass flow controllers and the inline gas monitor.

6. The apparatus of claim 5, wherein the controller includes:
   means for receiving from the inline gas monitor, a gas component and concentration signal;
   means for comparing the gas component and concentration signal with signals of the massflow controllers, and for arriving at a comparison; and
   means for controlling gas supply in accordance with the comparison.

7. The apparatus of claim 5, wherein the inline gas monitor includes:
   a gas flow pathway having first and second ends by which gas respectively enters and exits the gas monitor;
   a light source and a corresponding light sensor disposed on optically opposite sides of the gas flow pathway, the light source emitting light through a first window into the gas flow pathway and through a second window to be sensed differently by the corresponding light sensor based on differing gas components and concentrations in the flow pathway; and
   means for communicating to the controller, resulting gas component and concentration measurements from the light sensor.

8. An apparatus for supplying to semiconductor equipment, special material gases from a plurality of respective gas cylinders, the apparatus comprising:
   a plurality of pipe lines that are connected to respective gas cylinders from among the plurality of gas cylinders, the plurality of pipelines being connected in parallel and coming together at a junction;
   a plurality of massflow controllers disposed in respective pipe lines from among the plurality of pipe lines;
   a plurality of inline gas monitors, disposed in respective pipe lines from among the plurality of pipe lines;
   a junction pipe line that is connected between the junction and the semiconductor equipment; and
   a controller connected to the mass flow controllers and the inline gas monitors.

9. The apparatus of claim 8, wherein at least one of the inline gas monitors includes:

a gas flow pathway having first and second ends by which gas respectively enters and exits the gas monitor;

a light source and a corresponding light sensor disposed on optically opposite sides of the gas flow pathway, the light source emitting light through a first window into the gas flow pathway and through a second window to be sensed differently by the corresponding light sensor based on differing gas components and concentrations in the flow pathway; and means for communicating to the controller, resulting gas component and concentration measurements from the light sensor.

* * * * *